United States Patent [19]

Zirngibl

[11] Patent Number: 5,774,079
[45] Date of Patent: Jun. 30, 1998

[54] CIRCUIT ARRANGEMENT FOR CONVERTING A SERIAL DATA SIGNAL INTO A PARALLEL DATA SIGNAL

[75] Inventor: Wolfram Zirngibl, Schalbach, Germany

[73] Assignee: U.S. Phillps Corporation, New York, N.Y.

[21] Appl. No.: 512,423

[22] Filed: Aug. 8, 1995

[30] Foreign Application Priority Data

Aug. 12, 1994 [DE] Germany ............ 44 28 545.0

[51] Int. Cl.[6] .................................................. H03M 9/00
[52] U.S. Cl. ............................................ 341/100; 341/101
[58] Field of Search ................................ 341/100, 101, 341/106

[56] References Cited

U.S. PATENT DOCUMENTS 3,395,400  7/1968  De Witt et al. ............... 340/172.5
3,763,480  10/1973 Weimer ............................ 340/173
5,128,673  7/1992  Tamamura et al. .............. 341/100
5,223,833  6/1993  Akata ................................ 341/100
5,337,050  8/1994  Sugawara ......................... 341/100
5,548,285  8/1996  Ford et al. ........................ 341/100

Primary Examiner—Jeffrey A. Gaffin
Assistant Examiner—Peguy JeanPierre
Attorney, Agent, or Firm—Steven R. Biren

[57] ABSTRACT

A serial/parallel converter includes a shift register arrangement (12', 12" to 12″) and an output register arrangement (13', 13" to 13″), each of which includes n storage devices (12', 12" to 12″; 13', 13" to 13″). Each of the storage devices (13', 13" to 13″) of at least the output register arrangement includes two data inputs (DP, DS), a selection input (S) for selecting a data input, a clock input (CLK) as well as a data output (Q). The individual clock inputs (CLK) of the storage devices (13', 13" to 13″) receive a serial data signal and the selection inputs (S) receive a frequency-divided clock signal. Second data inputs (DS) of the storage devices (13', 13" to 13″) are connected to the data outputs (Q) of the shift register arrangement (12', 12" to 12″), the first data input (DP) of said storage devices being connected to the own data output (Q). The data signal can be derived in parallel from the data outputs (Q) of the storage devices (13', 13" to 13″).

4 Claims, 2 Drawing Sheets $t_{pd}$ = propagation delay $t_h$ = hold time $t_{su}$ = setup time

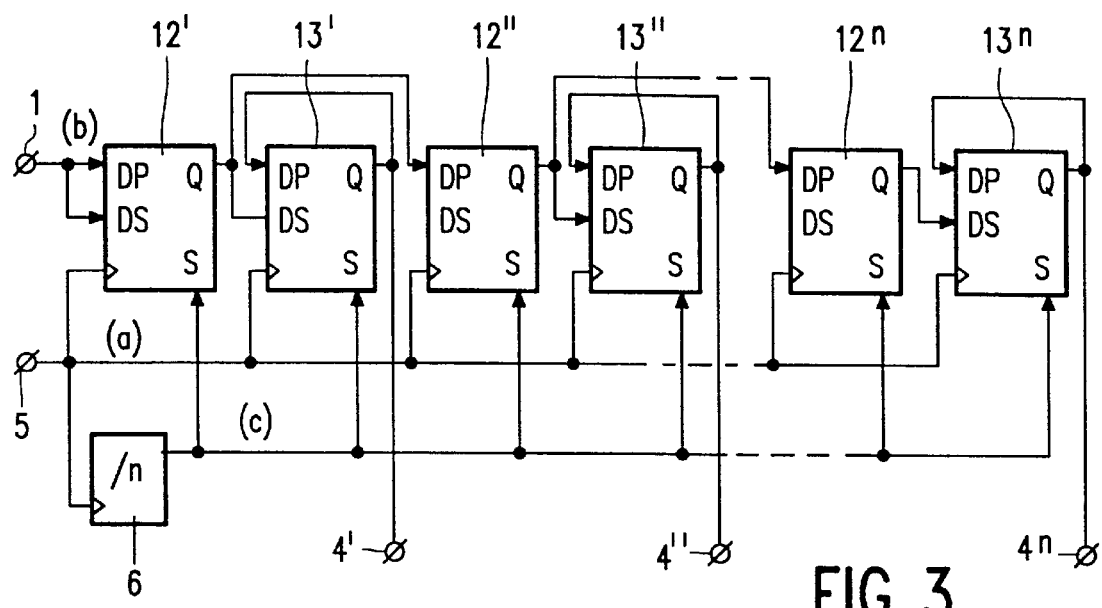
FIG. 3
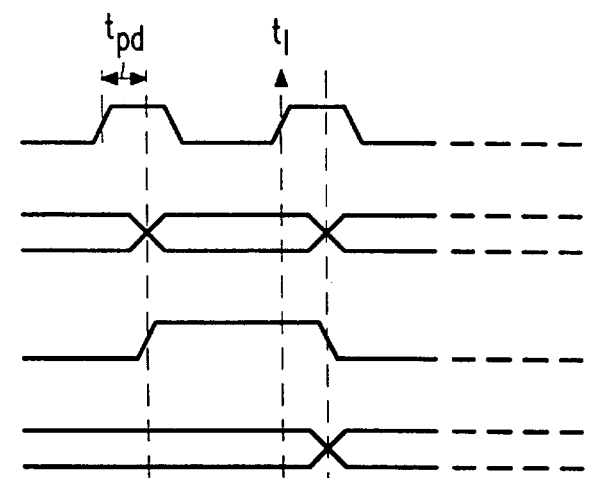
FIG. 4a
FIG. 4b
FIG. 4c
FIG. 4d
n−1 shift cycles | Loading cycle
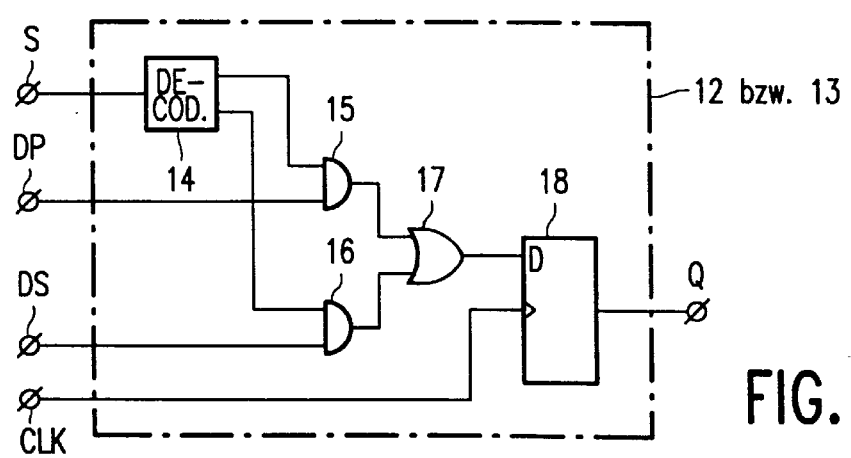
FIG. 5

CIRCUIT ARRANGEMENT FOR CONVERTING A SERIAL DATA SIGNAL INTO A PARALLEL DATA SIGNAL

BACKGROUND OF THE INVENTION

1. Field of the Invention

The invention relates to a circuit arrangement for converting a serial data signal into a parallel data signal, comprising a shift register arrangement which consists of n stages, and receives the serial data signal as well as a clock signal associated with the serial data signal and shifts the data of the serial data signal from one stage to another through the shift register arrangement in dependence on the clock signal and outputs, in parallel, data present on outputs of the stages, comprising an output register arrangement which consists of n stages, which receives in parallel the data output by the shift register arrangement, takes over these data in dependence on a frequency-divided clock signal and outputs these data as a parallel data signal on outputs of the stages, and also comprising a frequency divider arrangement which receives the clock signal associated with the serial data signal and which outputs on an output a frequency-divided clock signal for the output register arrangement.

2. Description of the Related Art

A circuit arrangement of this kind is known from U.S. Pat. No. 5,223,833. The maximum operating speed of such a circuit arrangement, also referred to as a series/parallel converter, is limited essentially by the timing of the clock signals controlling the data entry, because given set-up times and hold times of the registers used in the converter must be complied with and propagation delays must be taken into account.

Subject to the condition that the serial data signal and the frequency-divided (load) clock signal have been delayed relative to the serial (data) clock signal by the delay time of one register, for both signals a simultaneous change of state occurs. However, for reliable entry of the relevant data by way of the frequency-divided (load) clock, the relative position of the frequency-divided (load) clock with respect to the serial (data) clock must be corrected. The clock edge of the frequency-divided (load) clock must then be situated exclusively outside the interval determined by the set-up time and the hold time. For temporal correction of the clock signals, they could be fed via a given number of series-connected logic gates in order to realize adaptation by way of the gate propagation delay. Because of a tolerance-prone concatenation of the gate propagation delays, however, this step leads to incorrect phase correction of the clock signals, since the sum of the tolerances of the individual set-up and hold times of the registers typically exceeds the minimum feasible system cycle time. Moreover, the fact that such a step requires additional circuitry in the form of a given number of gates is also to be taken into account.

Generally speaking, correction of the clock phase positions by way of accurately specified delay lines is very expensive. Moreover, correction of the phase position of the two clock signals is also critical in view of the concatenation of sub-circuits. Inserted specified delay lines preclude a defined clock position relative to the clock at the input side so that, for example, in the case of parallel signal branches, careful matching of the clock phases must be carried out. Such matching may even be unreliable in individual cases.

SUMMARY OF THE INVENTION

It is an object of the present invention to increase the operating speed in a circuit arrangement of the kind set forth.

This object is achieved in that each stage of at least the output register arrangement comprises a storage device having a first and a second data input, a selection input for selecting the first or the second data input, a clock input as well as a data output, the clock input of each storage device receiving the clock signal associated with the serial data signal, the selection input of each storage device receiving the frequency-divided clock signal, the first data input being connected to the data output of the same storage device, and the second data input being connected to the data output of the corresponding stage of the shift register arrangement, the parallel data signal being available from the data outputs of the output register stages.

The circuit arrangement in accordance with the invention offers the advantage that the clock of the frequency-divided (load) clock signal determines from which of the two data inputs of the storage devices data are taken over. Because of this special connection, in one cycle of the frequency-divided (load) clock, the serial data are taken up in the output register arrangement from the data output of the same stage, so that the signal on the data output remains constant and is taken over in the $n^{th}$ serial (data) clock, via the second input of the shift register arrangement. The phase position of the clock signals thus need not be corrected. The maximum achievable operating speed of the circuit arrangement in accordance with the invention is thus limited only by the operating speed of the shift register and by the set-up and hold times of a device for switching over from one data input to the other data input of the storage device, because clock inputs of the output register arrangement and the shift register arrangement receive the same clock signal.

In order to equalize the switching delays of the shift register arrangement and the output register arrangement, it may be effective to construct the stages of the shift register arrangement by means of the same storage devices as the output register arrangement. The first and the second data inputs of at least the first storage device of the shift register arrangement then receive the serial signal in parallel, whereas the first data input of every subsequent stage is connected to the date output of the directly preceding stage and the second data input can also be supplied with a constant logic signal.

In an attractive embodiment of the invention, each storage device consists of a 1-to-2 decoder comprising an input and two outputs, a first and a second AND-gate with two inputs and one output each, first inputs of the AND-gates being connected to the two outputs of the 1-to-2 decoder and second inputs of the AND-gates being connected to the first and second data inputs, an OR-gate comprising two inputs and one output, the two inputs of the OR-gate being connected to the two outputs of the two AND-gates, a D-flipflop having a D-input, a clock input and a data output, the D-input being connected to the output of the OR-gate, the clock input receiving the clock signal associated with the serial data signal, and a data signal being available from the data output.

BRIEF DESCRIPTION OF THE DRAWINGS

The drawing shows an embodiment of the invention which will be described in detail hereinafter. In the drawings:

FIG. 3 shows the block diagram of a series/parallel converter in accordance with the invention;

FIGS. 4a–4d show voltage-time diagrams for the block diagram of FIG. 3; and

FIG. 5 shows the preferred connection of one of the storage devices used in the series/parallel converter in accordance with the invention.

Corresponding components are denoted by corresponding references in the Figures.

DESCRIPTION OF THE PREFERRED EMBODIMENT

Figures 1, 2C:
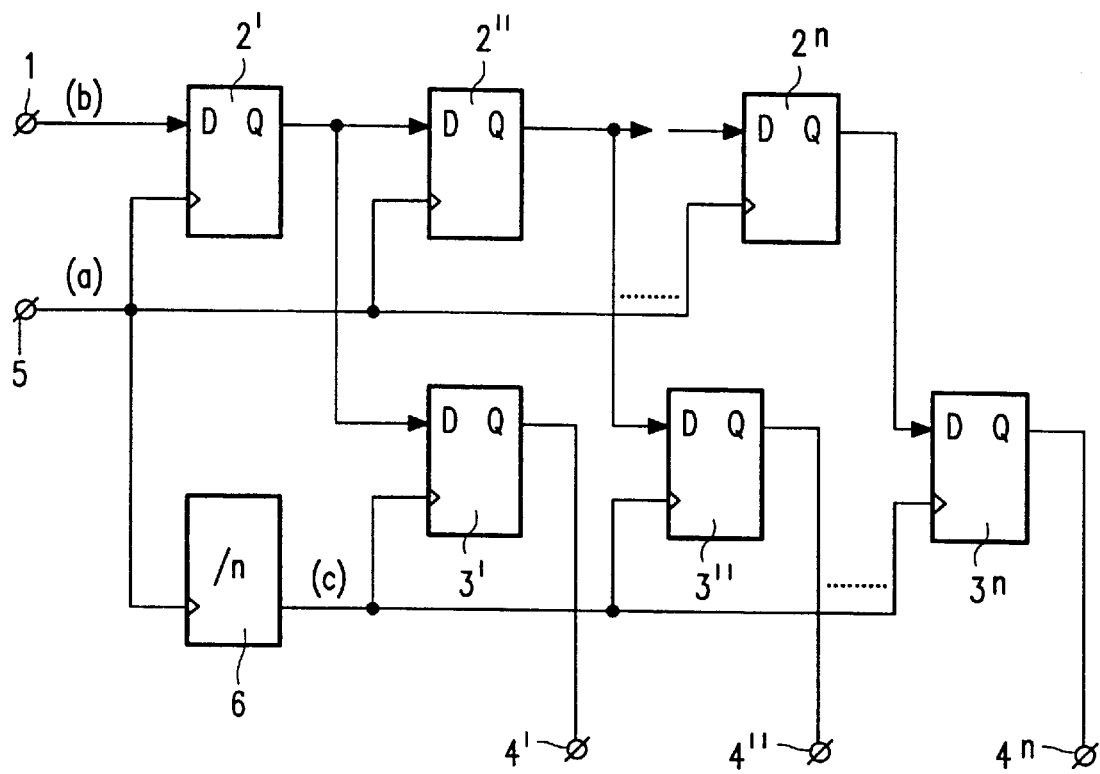
FIG. 1 shows the block diagram of a prior-art series/parallel converter.
FIGS. 2a–2d show voltage-time diagrams for the block diagram of FIG. 1.

FIG. 1 shows the block diagram of a known series/parallel converter. Via an input terminal 1 of this series/parallel converter, a serial data signal is applied to the input of an n-stage shift register which consists of a series connection of n D-flipflops 2', 2", 21$^n$. The serial data signal is present on the D-input of the first D-flip-flop 2'. The output Q of the first D-flipflop 2' is connected to the D-input of the second D-flipflop 2". Analogously, the outputs of the other D-flipflops 2" to 2$^n$ are connected to d-inputs of neighboring D-flipflops. Furthermore, the outputs Q of the D-flipflops 2', 2", 2$^n$ are connected to the D-inputs of further D-flipflops 3', 3", 3$^n$ which constitute an output register, so that the serial data signal is converted into an n-bit parallel data signal. The n-bit parallel data signal can be derived from output terminals 4', 4", 4$^n$ which are connected to outputs Q of the further D-flipflops 3', 3", 3$^n$.

The D-flipflops 2', 2", 2$^n$ of the shift register are clocked by a (data) clock signal which is present on a terminal 5 and which is transmitted in parallel with the serial data signal present on the input terminal 1. A frequency-divided (load) clock signal which is generated by a frequency divider 6 is applied to the clock inputs of the D-flipflops 3', 3", 3$^n$ of the output register. The frequency divider 6, receiving the (data) clock signal present on the terminal 5, divides the frequency of the (data) clock signal by n, where n denotes the number of bits per data word.

The serial data present on the terminal 1 are shifted from left to right through the individual stages (D-flipflops 2', 2" to 2$^n$) of the shift register under the control of the (data) clock signal present on the terminal 5. After n clock shift periods, an n-bit data word is present in parallel on the outputs Q of the D-flipflops 2', 2", 2$^n$, which data word is taken up in parallel by the D-flipflops 3', 3", 3$^n$ of the output register, under the control of the frequency-divided (load) clock signal, so as to be output word by word on the output terminals 4', 4", 4$^n$.

Figure 2A:
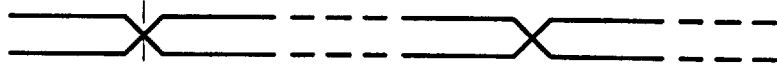
Figure 2B:
Figure 2D:
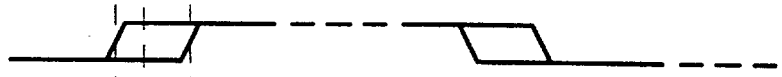

FIG. 2a shows parts of a voltage-time diagram of the clock signal present on the terminal 5. As has already been stated, this clock signal is transmitted in parallel with the serial data signal present on the input terminal 1. The associated serial data signal is shown in FIG. 2b. The edges of the serial data signal have been delayed by the propagation delay $t_{pd}$ with respect to the ascending edges of the clock signal. The frequency-divided clock signal (FIG. 2c) is assumed to change its state simultaneously with the edges of the serial data signals. Because reliable taking over of the data present on the outputs Q of the shift register is not possible with such a position in time of the frequency-divided clock signal, the relative position of the frequency-divided clock (FIG. 2c) with respect to the serial clock (FIG. 2a) must be corrected in such a manner that the clock edges are situated outside the interval determined by both times $t_h$ (hold time) and $t_{su}$ (set-up time). The necessary clock phase correction results in increased expenditure for circuitry and adjustment; nevertheless uncertainties remain as regards the taking over of data at high data rates.

These drawbacks are avoided in the series/parallel converter in accordance with the invention which is shown in FIG. 3. In this series/parallel converter, the serial data signal is also applied to the input of an n-stage shift register. This shift register consists in this example of a series connection of n storage devices 12', 12" to 12$^n$ whose special connection will be described in detail with reference to FIG. 5. The serial data signal applied to the input terminal is present simultaneously on the inputs DP and DS of the first storage device 12'. DP denotes a parallel data input and DS denotes a serial data input. The output Q of the first storage device 12' is connected to the input DP of the second storage device 12". Analogously, the outputs of the other storage devices 12" to 12$^n$ are connected to the inputs DP of the subsequent storage devices of the shift register. In the subsequent storage devices 12" to 12$^n$, however, the inputs DS remain open; they are internally connected to a logic L-level. The outputs Q of the n storage devices 12, 12" to 12$^n$ of the shift register are also connected to inputs DS of further storage devices 13', 13" to 13$^n$ which constitute the output register. In the output register, the data signals, which can be derived from the individual outputs Q, on the one hand, are applied to the output terminals 4', 4" to 4$^n$, wherefrom they can be derived in parallel with a word width of n bits, and, on the other hand, they are retrocoupled to an input DP of the preceding storage device 13', 13" or 13$^n$. Contrary to the known series/parallel converter (FIG. 1), in the series/parallel converter in accordance with the invention the clock inputs of the storage devices 12', 12" to 12$^n$ of the shift register as well as the clock inputs of the storage devices 13', 13" to 13$^n$ of the output register receive the (data) clock signal present on the terminal 5. Analogously, all selection inputs S of the storage devices 12', 12" to 12$^n$ and 13', 13" to 13$^n$ together receive the frequency-divided clock signal output by the frequency divider 6. Like the frequency divider 6 described with reference to FIG. 1, the frequency divider 6 provided herein also divides the frequency of the clock signal present on the terminal 5 by n in order to generate a corresponding word clock signal for the parallel data take-over.

The description of the operation of the series/parallel converter in accordance with the invention (FIG. 3) will be preceded by a description of the actual circuit of the storage devices 12', 12" to 12$^n$ and 13', 13" to 13$^n$ used in this example. FIG. 5 shows a preferred embodiment of the storage device. Each of the storage devices essentially comprises a 1-to-2 decoder 14 which is controlled by the frequency-divided clock signal, via a terminal S, and which outputs two switching signals via two outputs, said switching signals having either an L-level and a H-level or a H-level and a L-level, depending on the logic level of the frequency-divided clock signal on the terminal S. The 1-to-2 decoder may be realized, for example, by means of an IC of the type 74LS139 (Dual 2-to-4 Decoder), only one input and two outputs of which are used for decoding. Each of the storage devices also comprises two AND-gates 15 and 16, each of which comprises two inputs and one output. First inputs of the two AND-gates 15 and 16 receive the switching signals output by the 1-to-2 decoder. The second input of the AND-gate 15 is connected to the terminal DP and the second input AND-gate 16 is connected to the terminal DS. The outputs of the AND-gates 15 and 16 are connected to the inputs of an OR-gate 17 whose output is connected to the D-input of a D-flipflop 18. A clock input of the D-flipflop 18 receives the (serial) clock signal applied to the terminal CLK.

In the storage device shown in FIG. 5, the D-input of a D-flipflop is optionally connected, via a controlled switch (elements 14 to 17), to one of the two input terminals DP and DS. In dependence on the logic level of the frequency-divided clock signal on the terminal S, either the data signal present on the terminal DP or that present on the terminal DS is selected.

The embodiment of the controlled switch (elements 14 to 17) described with reference to FIG. 5, evidently can be replaced by another embodiment. Instead of the 1-to-2 decoder 14, an amplifier comprising an inverting output and a non-inverting output can be used.

In the series/parallel converter in accordance with the invention, the storage devices 12', 12" to $12^n$ and 13', 13" to $13^n$ cooperate in such a manner that, as in a shift register, in a cycle of the frequency-divided clock signal, the serial data are shifted from left to right (n-1)-times via the input DP of all storage devices 12', 12" to $12^n$ and simultaneously, in the storage devices 13', 13", to $13^n$, the own data contained therein are taken over, thus remaining unchanged during the (n-1) clock signals, while by the $n^{th}$ clock signal the data at the data outputs of the storage devices 12', 12" to $12^n$ are taken over in parallel via the input DS of all storage devices 13', 13" to $13^n$.

FIG. 4a shows the voltage-time diagram of the serial clock signal present on the terminal 5. FIG. 4b shows the voltage-time diagram of the serial data signal present on the terminal 1 which has been delayed by the propagation delay $t_{pd}$ with respect to the serial clock signal. The edges of the frequency-divided clock signal (FIG. 4c) occur at edge transitions of the serial data signal so as to take over the data in response to the serial clock in parallel, with the result that an n-bit parallel data signal is output (FIG. 4d). A customary clock phase correction can, therefore, be dispensed with. The maximum operating speed of the series/parallel converter in accordance with the invention is then determined exclusively by the set-up and hold times of the selection input S and the propagation delay in the flipflaps.

It will be evident that the shift register can also be implemented by simple storage devices comprising only one data input without a switch. The maximum operating speed, however, will not be raised as this speed is furthermore determined by the construction of the storage devices of the output register.

I claim:

1. A circuit arrangement for converting a serial data signal into a parallel data signal, comprising a shift register arrangement which comprises n stages, which receives the serial data signal as well as a clock signal associated with the serial data signal, and which shifts the data in the serial data signal from one stage to another through the shift register arrangement in dependence on the clock signal and outputs in parallel data present at outputs of the stages, comprising an output register arrangement which comprises n stages, which receives in parallel the data output by the shift register arrangement, takes over this data in dependence on a frequency-divided clock signal and outputs this data as a parallel data signal on outputs of the stages, and also comprising a frequency divider arrangement which receives the clock signal associated with the serial data signal and which provides on an output a frequency-divided clock signal for the output register arrangement, characterized in that each stage of at least the output register arrangement comprises a storage device having a first and a second data input, a selection input for selecting the first or the second data input, a clock input as well as a data output, the clock input of each storage device receiving the clock signal associated with the serial data signal, the selection input of each storage device receiving the frequency-divided clock signal, the first data input being connected to the data output of the same storage device and the second input being connected to the data output of the corresponding stage of the shift register arrangement, the parallel data signal being available from the data outputs of the output register stages.

2. A circuit arrangement as claimed in claim 1, characterized in that each of the storage devices comprises a D-flipflop with a D-input which, via selection circuit controlled by the frequency-divided clock signal, receives either the data signal at the first data input or the data signal at the second data input.

3. A circuit arrangement as claimed in claim 2, characterized in that each storage device comprises a 1-to-2 decoder comprising an input and two outputs, a first and a second AND-gate with two inputs and one output each, the first input of each AND-gate being connected to the two outputs of the 1-to-2 decoder and the second input of each AND-gate being connected to the first and second data inputs of the storage device, an OR-gate comprising two inputs and one output, the two inputs of the OR-gate being connected to the two outputs of the two AND-gates, a D-flipflop having a D-input, a clock input and a data output, the D-input being connected to the output of the OR-gate, the clock input receiving the clock signal associated with the serial data signal, and a data signal being provided from the data output.

4. A circuit arrangement as claimed in the claim 1, characterized in that each storage device comprises a 1-to-2 decoder comprising an input and two outputs, a first and a second AND-gate with two inputs and one output each, the first input of each AND-gate being connected to the two outputs of the 1-out-of-2 decoder and the second input of each AND-gate being connected to the first and second data inputs of the storage device, an OR-gate comprising two inputs and one output, the two inputs of the OR-gate being connected to the two outputs of the two AND-gates, a D-flipflop having a D-input, a clock input and a data output, the D-input being connected to the output of the OR-gate the clock input receiving, the clock input receiving the clock signal associated with the serial date signal, and a data signal being provided from the data output.

* * * * *